United States Patent [19]

Tanaka

[11] Patent Number: 4,585,969
[45] Date of Patent: Apr. 29, 1986

[54] PRECISION ROTARY MOVING MECHANISM USING PIEZOELECTRIC DRIVE ELEMENTS

[75] Inventor: Kuniyoshi Tanaka, Yokohama, Japan

[73] Assignee: Kabushiki Kaisha Toshiba, Kawasaki, Japan

[21] Appl. No.: 702,074

[22] Filed: Feb. 15, 1985

[30] Foreign Application Priority Data

Jun. 25, 1984 [JP] Japan .............................. 59-130539

[51] Int. Cl.⁴ ........................................... H01L 41/08
[52] U.S. Cl. .................................................... 310/328
[58] Field of Search ....................... 310/328, 317, 323

[56] References Cited

U.S. PATENT DOCUMENTS

| | | | |
|---|---|---|---|
| 3,684,904 | 8/1972 | Galutva et al. | 310/328 |
| 3,952,215 | 4/1976 | Sakitani | 310/328 |
| 4,163,168 | 7/1979 | Ishikawa et al. | 310/328 |
| 4,455,501 | 6/1984 | Tojo | 310/328 |
| 4,468,583 | 8/1984 | Mori | 310/328 |

FOREIGN PATENT DOCUMENTS 0871845 10/1981 U.S.S.R. .............................. 310/323

*Primary Examiner*—Mark O. Budd
*Attorney, Agent, or Firm*—Oblon, Fisher, Spivak, McClelland & Maier

[57] ABSTRACT

A precision moving mechanism can rotate a table continuously and precisely. A first drive disk is made of first and second movable sections and a resilient hinge connecting these sections. A first piezoelectric element has ends coupled to these sections, which can be attached to a first base by first and second members. A second drive disk is made of third and fourth movable sections and a resilient hinge connecting these sections. A second piezoelectric element has ends coupled to these sections, which can be attached to the second base by third and fourth members. The second and third sections are coupled to the second base and table, respectively. During the first period, the first member attaches the first section to the first base, the fourth member attaches the fourth section to the second base, and the first element expands, and the second element contracts, whereby the second section slightly rotates to rotate the table. During the second period, the second member 46 attaches the second section to the first base, the third member attaches the third section to the second base, the first element contracts and the second element expands, whereby the fourth section slightly rotates to rotate the table.

7 Claims, 24 Drawing Figures

F I G. 1
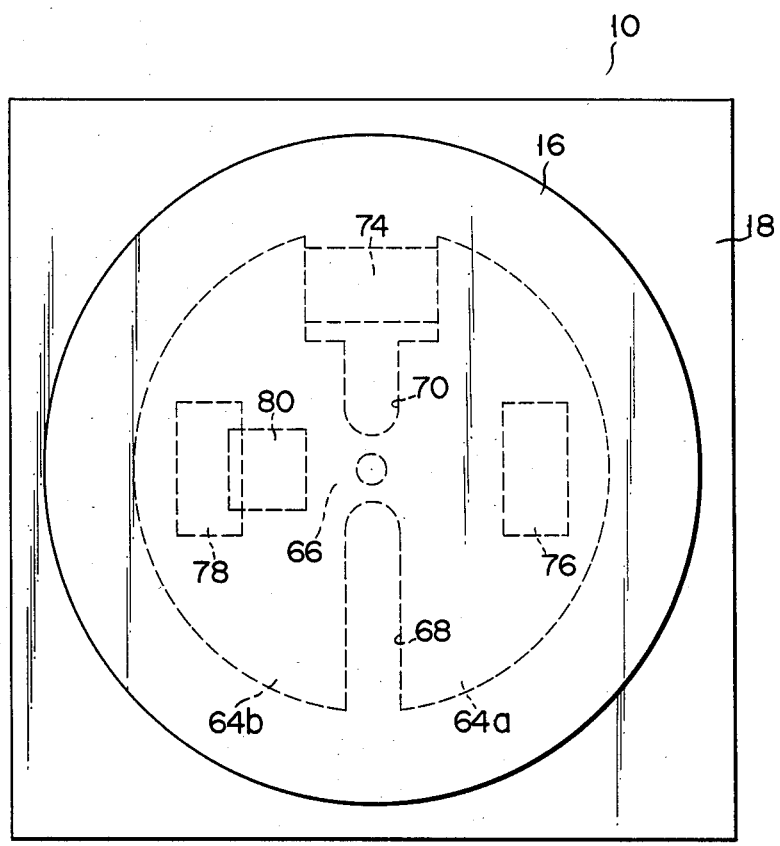

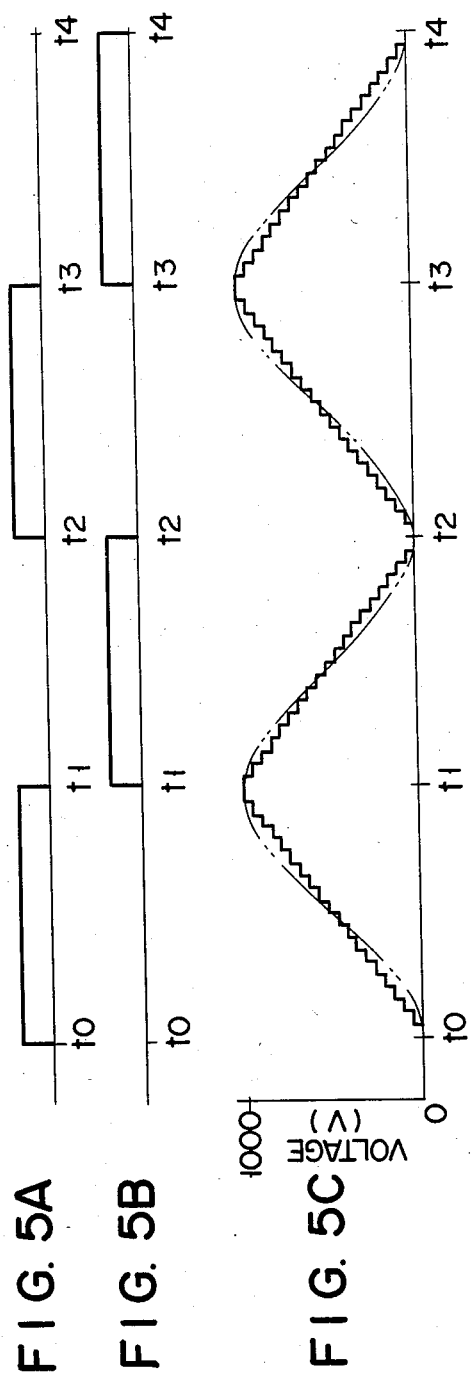

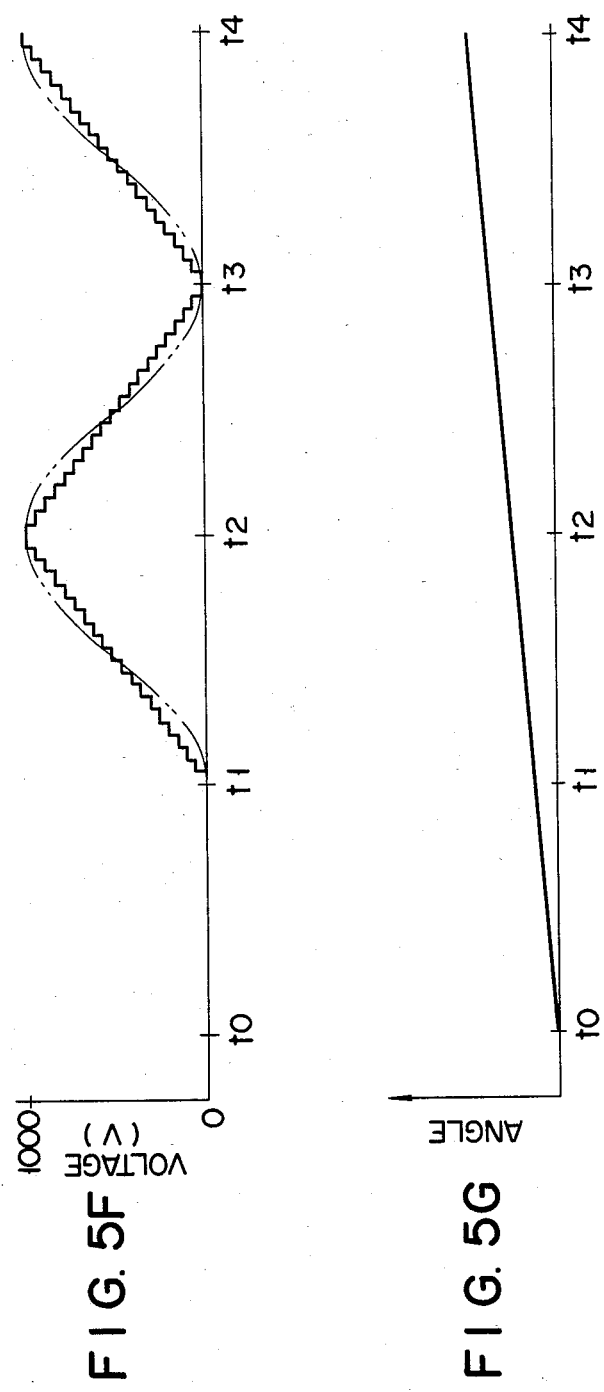

PRECISION ROTARY MOVING MECHANISM USING PIEZOELECTRIC DRIVE ELEMENTS

BACKGROUND OF THE INVENTION

The present invention relates to a precision moving mechanism which can move an object to a desired position at high speed and with a high precision.

In recent years, apparatus for forming fine patterns on a semiconductor wafer, mask film or the like have been developed. Among these apparatus are an electron beam exposure apparatus, a reduced image projection apparatus and an X-ray image transfer apparatus. These apparatus need to have a precision moving mechanism for moving a sample (i.e., a wafer, mask film, etc.) so slightly that patterns may be drawn on the sample with a high precision of a submicron. Some of the apparatus used in other fields of art may require a precision moving mechanism.

Various precision moving mechanisms have been developed. Among these is the fine rotation mechanism disclosed in U.S. Pat. No. 4,455,501 issued June 19, 1984. This mechanism has a piezoelectric element, which expands and contracts to very slightly move a sample, requiring no complex control. It comprises a rotational table for supporting a sample, a base, and a drive disk rotatably mounted on the base. The drive disk has first and second movable sections, one of which supports the rotational table. An piezoelectric element is provided between the movable sections. First and second stoppers are provided to make the movable sections immovable with respect to the base. They are alternately driven by a stopper drive means. A voltage generator is provided to apply a voltage to the piezoelectric element, so that the element expands every time one of the stoppers is driven and contracts every time the other stopper is driven. However, the mechanism is disadvantageous in the following respect.

The table can indeed be rotated at a desired speed, but it rotates intermittently. Obviously, it takes much longer to move the sample to a desired position than when the table is continuously rotated. To move the sample more quickly, the stoppers may be driven more frequently and a voltage of a higher frequency may be applied to the piezoelectric element. The higher the frequency of the voltage, the lower is the impedance of the load circuit including this element. This is because a piezoelectric element is a capacitive load. When the impedance of the load circuit is lowered, the output impedance of the voltage generator must be proportionally lowered. However, it is difficult to design a voltage generator which can stably amplify the input AC signal and whose output impedance is low, without damaging the response of the voltage generator.

SUMMARY OF THE INVENTION

The object of this invention is to provide a precision moving mechanism which can move or rotate an object to a desired position at high speed and with high precision.

According to the invention, two slight moving mechanism units for rotating or linearly moving an object are coupled, functioning as a master unit and a slave unit, respectively.

More specifically, a precision moving mechanism of this invention comprises a first base, a first drive disk movably mounted on the first base and having first and second movable sections, a first piezoelectric element connected at one end to the first movable section and at the other end to the second movable section, a first member for attaching the first movable section to the first base, and a second member for attaching the second movable section to the first base. The mechanism further comprising a second base supported by the first or second movable section, a second drive disk movably mounted on the second base and having third and fourth movable sections, a second piezoelectric element connected at one end to the third movable section and at the other end to the fourth movable section, a third member for attaching the third movable section to the second base, a fourth member for attaching the fourth movable section to the second base, and a table supported by the third or fourth movable section. The mechanism further includes a drive means and a voltage generating means. The drive means alternately drives the first and second members and alternately drives the third and fourth members. Further, it alternately drives the first or second member for attaching the movable section supporting the second base to the first base and the third or fourth member for attaching the movable section supporting the table to the second base. The voltage generating means applies a voltage to the first and second piezoelectric elements. This voltage varies in synchronism with the drive cycle of the first and third members and causes the first and second piezoelectric elements to expand and contract with a phase difference of 180°.

The first base, first drive disk, first piezoelectric element, first member and second member constitute a first slight moving mechanism unit. The second base, second drive disk, second piezoelectric element, third member and fourth member constitute a second slight moving mechanism unit. One of these units is driven, while the other is not, or vice versa. Hence, the table is continuously rotated at a speed twice higher than in the known precision moving mechanism, when the voltage applied to the piezoelectric elements are the same as that of the voltage applied to the piezoelectric element of the known mechanism. Further, the voltage generating means need not be so complex, nor so expensive as that used in the known mechanism. The mechanism of this invention can thus be made at low cost.

BRIEF DESCRIPTION OF THE DRAWINGS

FIG. 1 is a plan view of a precision moving mechanism according to the invention;

FIG. 5A to 5G is a timing chart showing the various signals output by the driver unit shown in FIG. 4;

DETAILED DESCRIPTION OF THE PREFERRED EMBODIMENTS

Figure 2:
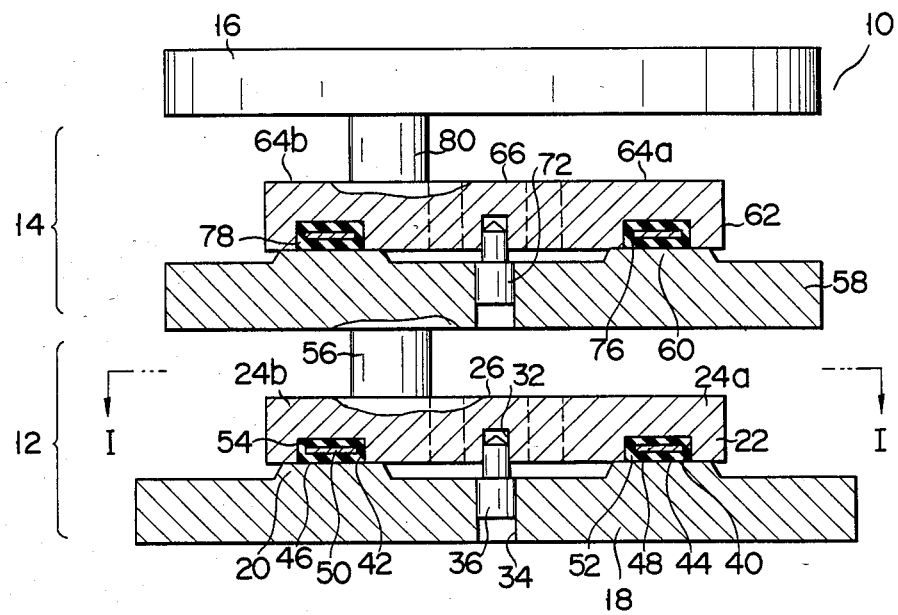
FIG. 2 is a partially sectional, side view of the mechanism shown in FIG. 1.

FIGS. 1 and 2 show the main section 10 of a precision moving mechanism according to the invention. As shown in FIG. 2, this section 10 comprises a first slight moving mechanism unit 12, a second slight moving mechanism unit 14 mounted on the unit 12 and having the same structure as the unit 12, and a turntable 16 supported by the second unit 14.

Figure 3:
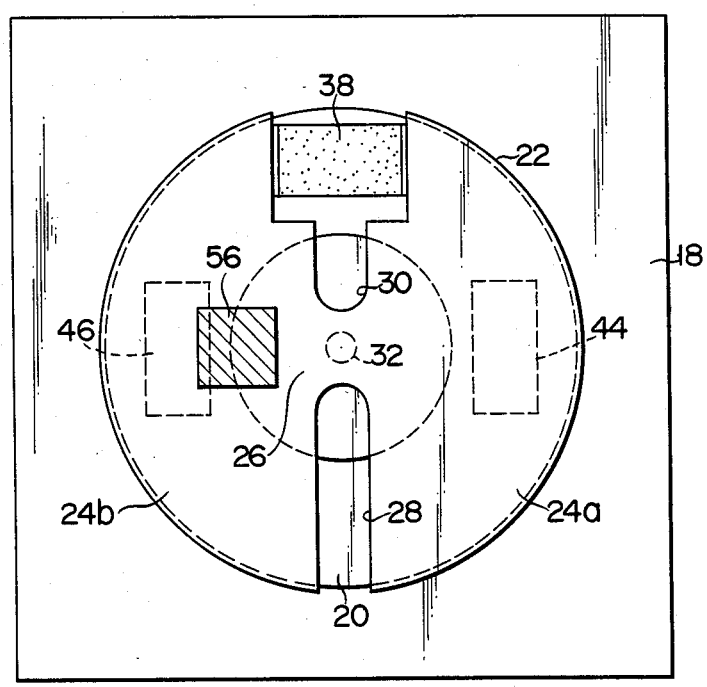
FIG. 3 is a cross-sectional view of the mechanism, taken along line I—I in FIG. 2.

The first slight moving mechanism unit 12 comprises a first base 18 and a first drive disk 22. The base 18 is a square plate. A ring 20 is formed on the upper surface of the base 18. The ring 20 has a smooth upper surface, on which the first drive disk 22 is mounted. As shown in FIG. 3, the disk 22 consists of a first movable section 24a and a second movable section 24b, both being semicircular plates, and a resilient hinge 26 connecting the center portions of these sections 24a and 24b. The disk 22 is made by cutting two slits 28 and 30 in a disk, which extend in opposing radial directions and do not reach the center of the disk. That portion of the disk, which is left between the closed ends of these slits 28 and 30 is the resilient hinge 26. The two halves, which are separated by the slits 28 and 30, are the first and second movable sections 24a and 24b. As shown in FIG. 2, a hole 32 is cut in the lower surface of the hinge 26. The base 18 has a through hole 34. This hole 34 is coaxial with the hole 32. A shaft 36 is fitted in the hole 34 and protrudes into the hole 32. Hence, the drive disk 22 may rotate around this shaft. As shown in FIG. 3, the slit 30 has an inner, narrow portion and an outer, broad portion. A first piezoelectric element 38 made of zirconium titanate, lead titanate, or the like, is put in the outer portion of the slit 30. The element 38 is shaped like a rod and secured at one end to the first movable section 24a and at the other end to the second movable section 24b, by means of adhesive, screws, etc. Alternatively, holes may be cut in the opposing faces of the sections 24a and 24b, and the end portions of the elements 38 may be fitted in these holes. As illustrated in FIG. 2, two square recesses 40 and 42 are cut in the lower surfaces of the movable sections 24a and 24b, and open to the ring member 20. Two electrostatic chucks 44 and 46 (i.e., first and second members) are held within these recesses 40 and 42, respectively. The chuck 44 consists of an electrode 48 and an insulative member 52 wrapping the electrode 48. Similarly, the chuck 46 consists of an electrode 50 and an insulative member 54 wrapping the electrode 50. The chuck 44 is energized to attach the first movable section 24a to the first base 18, and the chuck 46 is energized to attach the second movable section 24b to the base 18. A support 56 is secured, at its lower end, to the upper surface of the second movable section 24b. The upper end of this support 56 is fastened to that portion of a second base 58 which deviates from the center of rotation of the base 58.

The second slight moving mechanism unit 14 is structurally identical with the first unit 12, except that the second base 58 is a disk, unlike the first base 18 that is a square plate. The base 58 is coaxial with the shaft 36. The unit 14 comprises a ring member 60 formed on the upper surface of the base 58, and a second drive disk 62 mounted on the ring member 60. The disk 62 consists of third and fourth movable sections 64a and 64b, and a resilient hinge 66 connecting these sections 64a and 64b.

The unit 14 further comprises a shaft 72, a second piezoelectric element 74, two electrostatic chucks 76 and 78, and a support 80. The shaft 72 is fitted in a center hole of the base 58, positioned coaxially with the shaft 36 and supporting the drive disk 62. The element 74 is placed in the slit 70 of the disk 62. The chucks 76 and 78 (i.e., third and fourth members) are held within the recesses cut in the lower surfaces of the movable sections 64a and 64b. The support 80 is secured at one end to the movable section 64b and at the other end to the turntable 16.

When the precision moving mechanism is used in an electron beam exposure apparatus, a reduced image projection apparatus or an X-ray image transfer apparatus, it is desired that the turntable 16, bases 18 and 58, drive disks 22 and 62 and other associated parts be made of nonmagnetic materials such as beryllium copper, aluminum and titanium. These parts, if made of nonmagnetic materials, do not adversely influence the magnetic field, which is necessary in these apparatus, so that patterns may be drawn on or transferred to a sample with a high precision.

Figure 4:
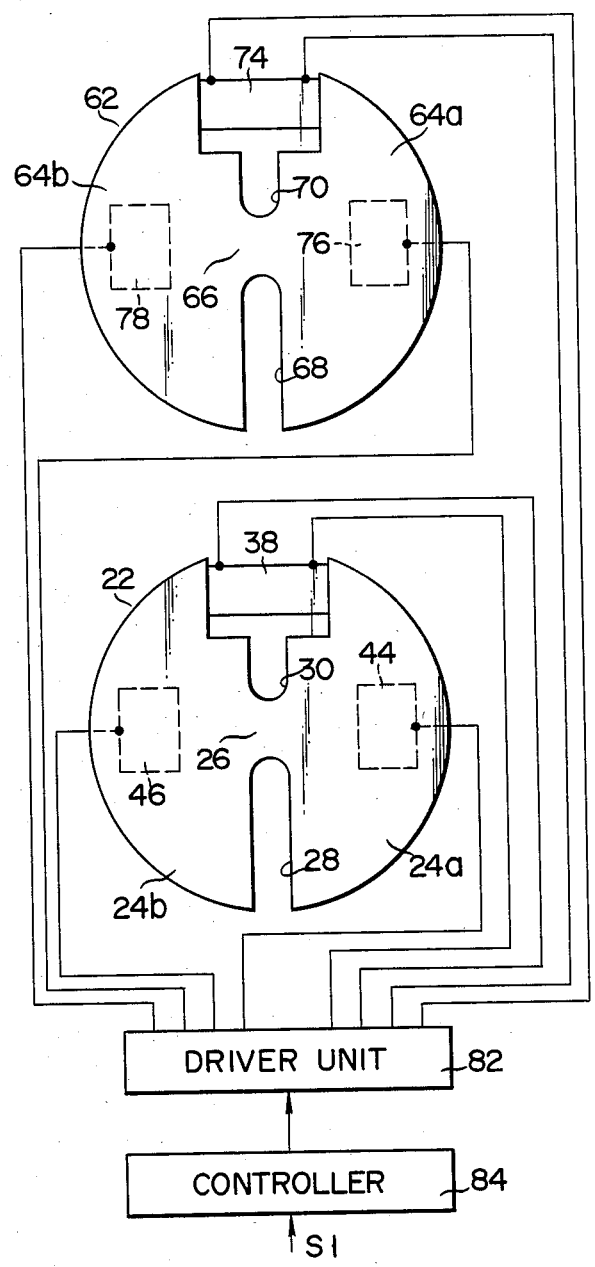
FIG. 4 shows an electrical circuit for driving the mechanism.

FIG. 4 schematically shows the precision moving mechanism. As shown in this figure, the piezoelectric elements 38 and 74 and the electrodes of the chucks 44, 46, 76 and 78 are connected to a driver unit 82. This driver unit 82 is connected to a controller 84 made of a microcomputer or the like.

The operation of the mechanism shown in FIGS. 1 to 4 will now be explained with reference to FIGS. 5A to 5G and FIGS. 6A to 6D. Suppose a start signal S1 is supplied to the controller 84 at time $t_0$. The driver unit 82 starts and applies a voltage signal (FIG. 5A) to the electrostatic chuck 44. Simultaneously, it supplies a voltage signal (FIG. 5E) to the electrostatic chuck 78. As a result, the first movable section 24a is attached to the first base 18, and the fourth movable section 64b is attached to the second base 58. At time $t_0$, the driver unit 82 starts applying the voltage shown in FIG. 5C to the piezoelectric element 38. This voltage rises stepwise until time $t_1$ and thereafter falls stepwise until time $t_2$. The element 38 gradually expands until time $t_1$, thus widening the slit 30, or pushing away the movable sections 24a and 24b. Since the first movable section 24a is secured to the first base 18, the second movable section 24b rotates counterclockwise around the shaft 36 by a very small angle. The section 24a is coupled to the support 56 secured to the second base 58 to which the fourth movable section 64b is now attached. This section 64b is secured to the support 80, which is connected to the turntable 16. Hence, when the movable section 24a rotates through a small angle, the turntable 16 is slightly rotated in the same direction. FIG. 5G shows how the angle of rotation of the turntable 16 changes with time.

Figure 6A:
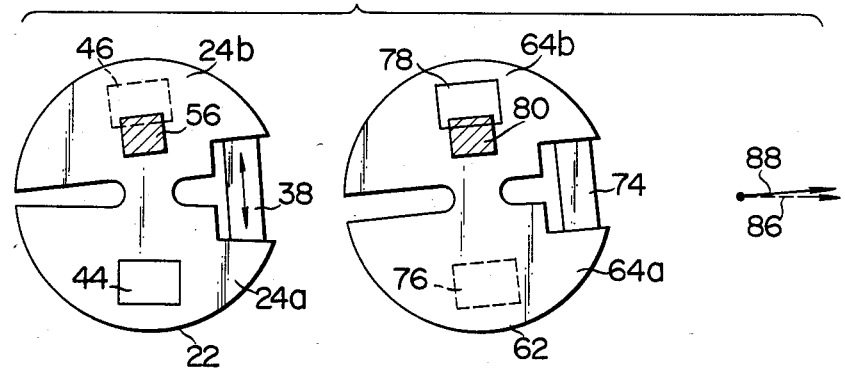
FIG. 6A to 6D illustrate how the drive disk and turntable both shown in FIG. 4 operate.

The drive disks 22 and 62 take the positions shown in FIG. 6A during a period T, time $t_0$ to time $t_1$. During this period, the turntable 16 rotates from the position indicated by a broken-line arrow 86 to the position indicated by a solid-line arrow 88. At time $t_1$, the voltage applied to the element 38 reaches its maximum as shown in FIG. 5C. In FIGS. 6A to 6D, any electrostatic chuck that is energized is indicated by a solid line, and any electrostatic chuck that is deenergized is indicated by a broken line.

Figure 6B:
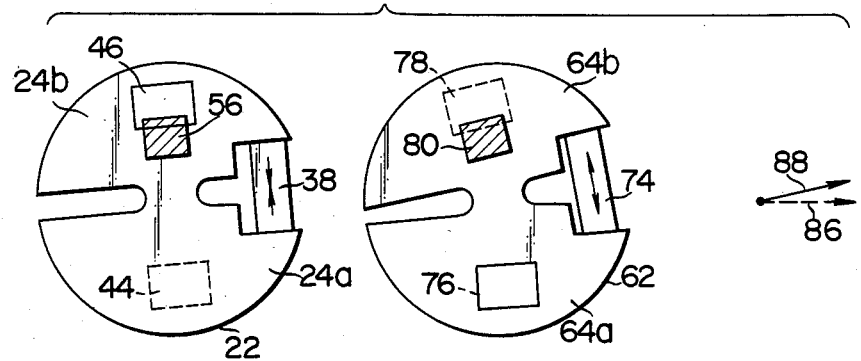

At time $t_1$, the voltage application to the chuck 44 is stopped as shown in FIG. 5A. At the same time, the voltage application to the chuck 46 is started as shown in FIG. 5B. Also at time t₁, the voltage application to the chuck 78 is stopped as shown in FIG. 5E, and the voltage application to the chuck 76 is started as shown in FIG. 5D. Thus, the movable sections 24b and 64a are attached to the base plates 18 and 58 at time t₁. As shown in FIG. 5C, the voltage applied to the element 38 starts falling stepwise at time t₁. At the same time, a voltage (FIG. 5F) is applied to the element 74. This voltage rises stepwise from 0 V until time t₂ and then falls stepwise from its maximum until time t₃, and again rises stepwise until time t₄. The element 38 contracts as the voltage applied to it falls. Hence, the movable section 24a is rotated counterclockwise by the restoring force of the resilient hinge 26, thus returning to its initial position with respect to the movable section 24b (FIG. 6B). Since the section 24a is no longer attached to the base 18, its rotation is not transmitted to the turntable 16. In the meantime, the piezoelectric element 74 expands as the voltage applied to it rises stepwise as shown in FIG. 5F. The slit 70 of the drive disk 62 is gradually broadened. The movable section 64a is attached to the base 58 at this time, and the disk 62 is rotatable about the shaft 72. Therefore, the movable section 64b rotates counterclockwise by a very small angle. Since the section 64b is coupled to the table 16 by the support 80, the turntable 16 is rotated in the same direction by a small angle.

From time t₁ to time t₂, the drive disks 22 and 62 have a positional relation as shown in FIG. 6B. At time t₂, the turntable 16 has rotated by the angle defined by arrows 86 and 88 shown in FIG. 6B. At time t₂, the voltage applied to the piezoelectric element 38 reaches 0 V as shown in FIG. 5C, and the voltage applied to the piezoelectric element 74 reaches the maximum value as shown in FIG. 5F.

Figure 6C:
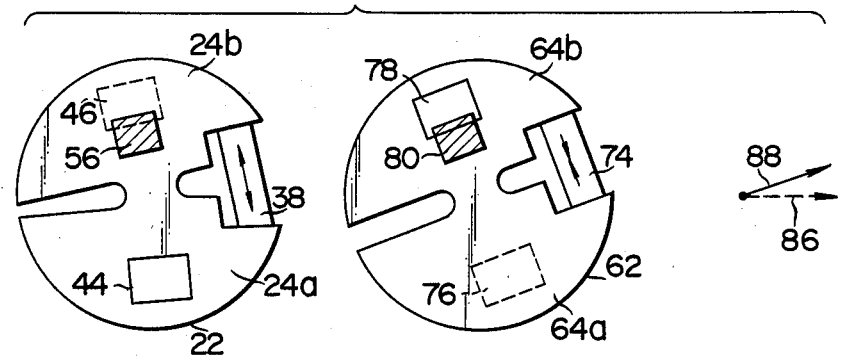

At time t₂, the voltage application to the chuck 46 is stopped as illustrated in FIG. 5B. At the same time, the voltage application to the chuck 44 is started as shown in FIG. 5A, the voltage application to the chuck 76 is stopped as shown in FIG. 5D, and the voltage application to the chuck 78 is started as shown in FIG. 5E. Consequently, the movable sections 24a and 64b are attached to the bases 18 and 58. At time t₂, the voltage applied to the piezoelectric element 38 starts rising stepwise as shown in FIG. 5C, whereas the voltage applied to the element 74 begins to fall stepwise as shown in FIG. 5F. The element 38 therefore expands. The movable section 24a is attached to the base 18, and the movable section 24b is rotatable at this time. Hence, the section 24b rotates counterclockwise by a very small angle. This rotation is transmitted to the turntable 16 through the support 56, base 58, movable section 64b now attached to the base 58, and support 80. The turntable 16 therefore rotates coulterclockwise by a very small angle. On the other hand, the piezoelectric element 74 begins to contract. Since the section 64a is rotatable at this time, it is rotated counterclockwise by the restoring force of the resilient hinge 66, thus taking the initial positional relation with the movable section 64b (FIG. 6C). The rotation of the section 64a is not transmitted to the turntable 16.

From time t₂ to time t₃, the drive disks 22 and 62 take the positions shown in FIG. 6C, and the turntable 16 further rotates to the position shown by arrow 88. At time t₃, the voltage applied to the piezoelectric element 38 reaches its maximum value as shown in FIG. 5C, whereas the voltage applied to the piezoelectric element 74 has fallen to 0 V as shown in FIG. 5F.

Figure 6D:
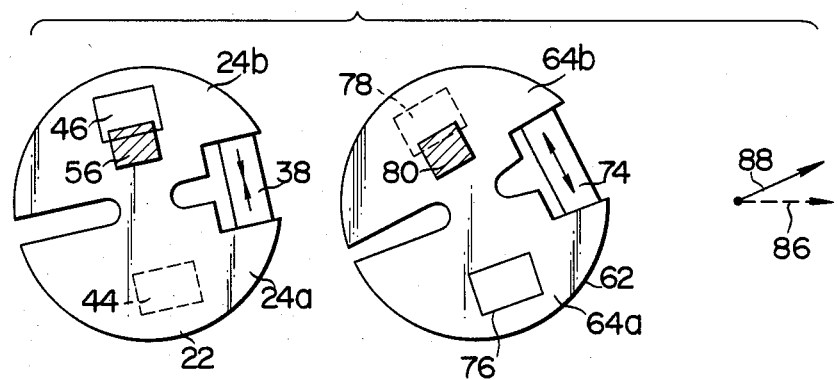

As is understood from the above, the voltages applied to piezoelectric elements 38 and 74 have a phase difference of 180°. Therefore, one of these elements expands, while the other contracts. As long as the voltages are applied to the elements 38 and 74, the turntable 16 continues to rotate. The voltages are applied to the elements until the turntable rotates to the position specified by the data input to the controller 84. FIG. 6D illustrates the positional relation that the drive disks 22 and 62 take immediately before time t₄, and the angle of rotation of the table 16 at time t₄. The order in which the electrostatic chucks are energized may be reversed and the phase relation of the voltages applied to the elements 38 and 74 may be altered, so as to rotate the turntable 16 clockwise.

In the precision moving mechanism described above, while the movable section 24b, which is connected to the base 58 by the support 56, is rotating through a very small angle, and the movable section 64b, which is coupled to the turntable 16 by the support 80, cannot rotate. Conversely, while the movable section 64b is rotating through a very small angle, the movable section 24b cannot rotate. Due to this, the table 16 continuously rotates as explained by FIG. 5G. For this reason, the mechanism can rotate a sample two times faster than the conventional precision moving mechanism when the piezoelectric elements expand and contract at the same frequency. Unlike the known mechanism, it can move a sample at high speed without causing the piezoelectric elements to expand and contract more frequently.

In the mechanism described above, a voltage whose waveform is triangular and which stepwise rises and falls is applied to each piezoelectric element. This voltage may be replaced by a voltage which changes along sine waves as indicated by chain lines in FIGS. 5C and 5F.

Figure 7:
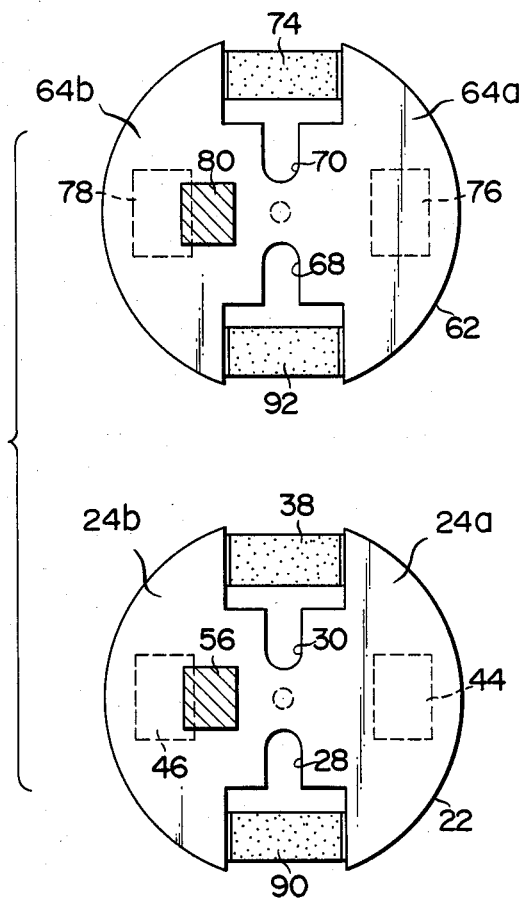
FIG. 7 is a plan view of another drive disk of the present invention.

As mentioned above, a piezoelectric element is placed in only one of the slits of each drive disk. As shown in FIG. 7, a third piezoelectric element 90 may be arranged in the slit 28 of the drive disk 22, and a fourth piezoelectric element 92 may be provided in the slit 68 of the drive disk 62. This embodiment operates in the same way as the mechanism of FIGS. 1 to 4, when voltages are applied to the four piezoelectric elements in the following manner. First, a rising voltage is applied to the element 38 to make it expand, while a falling voltge is applied to the element 90 to make it contract. A falling voltage is then applied to the element 38, while a rising voltage is applied to the element 90. This two-step voltage application is repeated. Rising and falling voltages are applied to the elements 74 and 92 attached to the drive disk 62, exactly in the same manner as in the case of the elements 38 and 90. The four piezoelectric elements alternately expand and contract, thereby rotating the turntable 16 continuously.

Another precision moving mechanism, according to the invention, will be described with reference to FIGS. 8 and 9. This mechanism is designed so as to turn a table or to linearly move the same.

Figure 8:
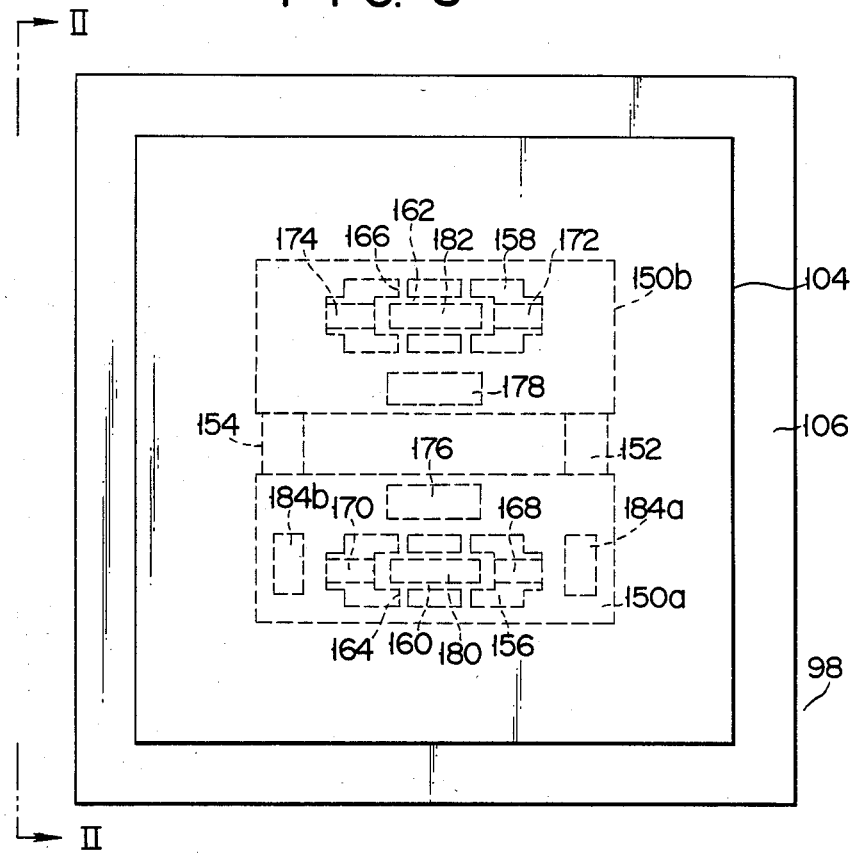
FIG. 8 is a plan view of another precision moving mechanism according to the present invention.
Figure 9:
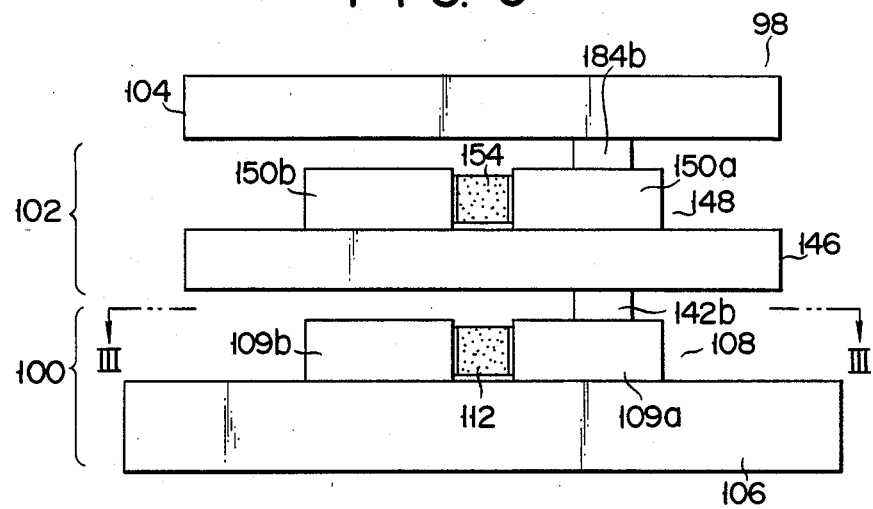
FIG. 9 is a cross-sectional view of the mechanism shown in FIG. 8, taken along line II—II in FIG. 8.

As FIGS. 8 and 9 show, the main section 98 of this precision moving mechanism comprises a first slight moving mechanism unit 100, a second slight moving mechanism unit 102 supported by the unit 100, and a table 104 supported by the unit 102.

Figure 10:
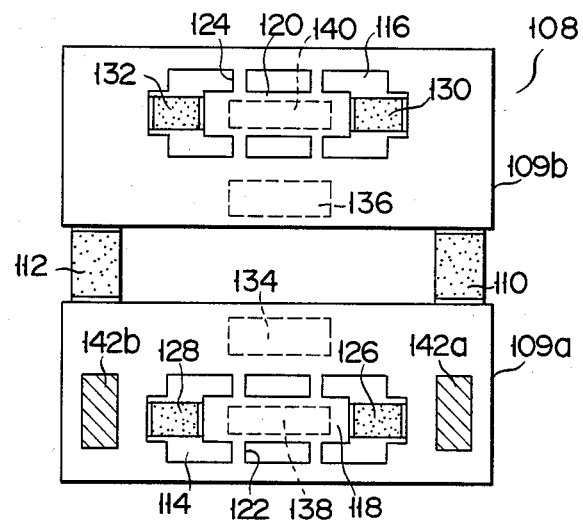
FIG. 10 is a cross-sectional view of the mechanism of FIG. 8, taken along line III—III in FIG. 9.

The first slight moving mechanism 100 comprises a first base 106 and a first drive plate 108 mounted on the base 106. As shown in FIG. 10, first drive plate 108 consists of a first movable section 109a and a second movable section 109b. These sections 109a and 190b are rectangular plates of the same size and positioned in the same plane side by side. They are connected to each other by a first piezoelectric element 110 and a third piezoelectric element 112. More specifically, the elements 110 and 112 are coupled at one end to one longer side of the movable section 109a and at the other end to that longer side of the movable section 109b which opposes said longer side of the section 109a. The sections 109a and 109b have rectangular holes 114 and 116 extending at right angles to the line along which the elements 110 and 112 expand and contract when voltages are applied to them. A first assist movable section 118 and a second assist movable section 120 are arranged in these holes 114 and 116, respectively. The sections 118 and 120 have a shape similar to that of the holes 114 and 116. Four resilient hinges 122 connect the assist movable section 118 to the longer inner edges of the hole 114. Similarly, four resilient hinges 124 connect the assist movable section 120 to the longer edges of the hole 116. A piezoelectric element 126 is provided between the right end of the section 118 and the right shorter edge of the hole 114, and a piezoelectric element 128 is placed between the left end of the section 118 and the left shorter edge of the hole 114. Likewise, a piezoelectric element 130 is provided between the right end of the section 120 and the right shorter edge of the hole 116, and a piezoelectric element 132 is provided between the left end of the section 120 and the left shorter edge of the hole 116. These elements 126, 128, 130 and 132 can expand and contract in the direction crossing the direction of the expansion and contraction of the first and third piezoelectric elements 110 and 112. Two electrostatic chucks 134 and 136 (i.e., first and second members) are secured to the lower surfaces of the movable sections 109a and 109b. Also, two electrostatic chucks 138 and 140 are secured to the lower surfaces of the assist movable sections 118 and 120. The movable section 109a is coupled to the base 146 of the second slight moving mechanism unit 102 by two supports 142a and 142b.

The second slight moving mechanism unit 102 has almost the same structure as the first slight moving mechanism unit 100. As shown in FIG. 9, it comprises the second base 146 and a second drive plate 148 mounted on the base 146. As shown in FIG. 8, the plate 148 consists a third movable section 150a and a fourth movable section 150b. The sections 150a and 150b are coupled by second and fourth piezoelectric elements 152 and 154. The sections 150a and 150b have rectangular holes 156 and 158. A third assist moving section 160 is arranged in the hole 156, and a fourth assist moving section 162 is positioned in the hole 158. The section 160 is connected to the longer edges of the hole 156 by four resilient hinges 164. Similarly, the section 162 is coupled to the longer edges of the hole 158 by four resilient hinges 166. A piezoelectric element 168 is provided between the right end of the section 160 and the right shorter edge of the hole 156, and a piezoelectric element 170 is placed between the left end of the section 160 and the left shorter edge of the hole 156. Likewise, a piezoelectric element 172 is provided between the right end of the section 162 and the right shorter edge of the hole 158, and a piezoelectric element 174 is provided between the left end of the section 162 and the left shorter edge of the hole 158. Two electrostatic chucks 176 and 178 (i.e., third and fourth members) are secured to the lower surfaces of the sections 150a and 150b. Two more electrostatic chucks 180 and 182 are secured to the lower surfaces of the assist movable sections 160 and 162. The movable section 150a is coupled to the table 104 by a two support 184a and 184b.

Figure 11:
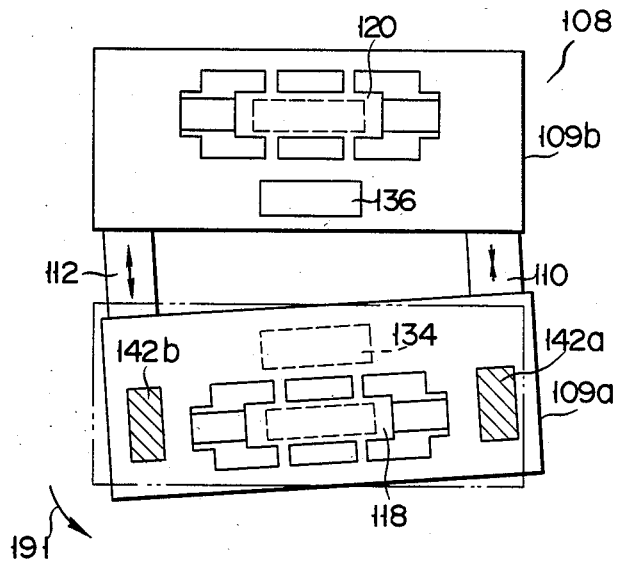
FIGS. 11, 12A, 12B, 13A and 13B illustrate how the drive disk of FIG. 10 is operated.

The mechanism of FIGS. 8 to 10 operates in the following way to rotate the table 104 continuously. During the first period, the electrostatic chucks 136 and 176 are energized, thereby attaching the movable sections 109b and 150a to the bases 106 and 146. Also during this period, the piezoelectric elements 112 and 152 are made to expand, and the elements 110 and 154 are simultaneously made to contract, as illustrated in FIG. 11. As a result, the movable section 109a rotates by a very small angle, counterclockwise as indicated by arrow 191, and the movable section 150b rotates by a very small angle. Since the section 150a is attached to the base 146, the rotation of the section 109a is transmitted to the table 104 through the base 146 and movable section 150a. The rotation of the movable section 150b is not transmitted to the table 104 since it is not coupled to the table 104 unlike the section 150a.

During the second period, the chucks 136 and 176 are deenergized, releasing the movable sections 109b and 150a from the bases 106 and 146, and the chucks 134 and 178 are energized, thus attaching the movable sections 109a and 150b to the bases 106 and 146. Further, the elements 112 and 152 are made to contract, and the elements 110 and 154 are made to expand at the same time. As a result, the movable sections 109b and 150a rotate by a very small angle. Since the section 109a is attached to the base 106 during the second period, the rotation of only the section 150a is conveyed to the table 104.

As the electrostatic chucks 134, 136, 176 and 178 are repeatedly energized and deenergized, and the elements 110, 112, 152 and 154 expand and contract, in the manner as described above, the table 104 continues to rotate counterclockwise. The order in which the electrostatic chucks are energized may be reversed, the phase relation of the voltages applied to the elements 110 and 112, and the phase relation of the voltages applied to the elements 152 and 154 may be altered, so as to rotate the table 104 clockwise.

The precise moving mechanism of FIGS. 8 to 10 operates in the following way to linearly move the table 104 in any desired direction. For simplicity of explanation, the operation of only the first slight moving mechanism unit 100 will be described.

Figure 12A:
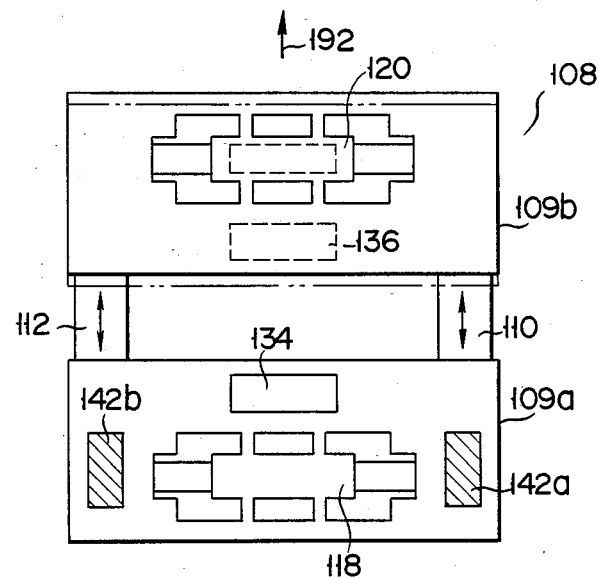
Figure 12B:
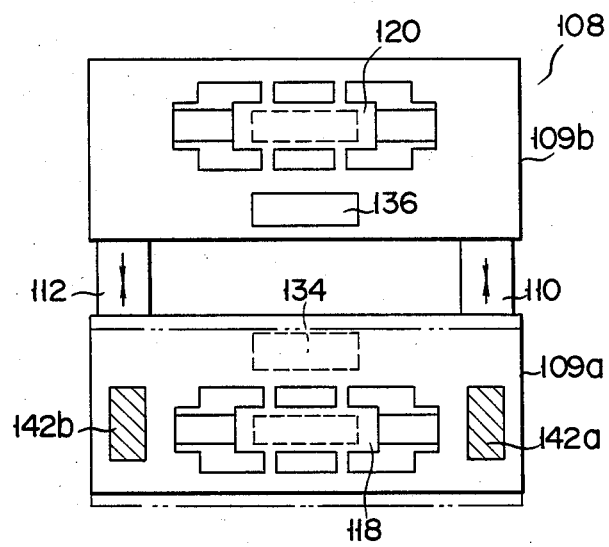
Figure 13A:
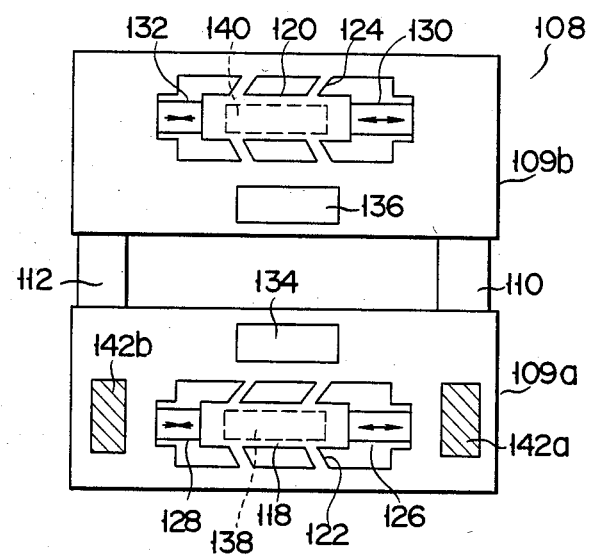

During the first period, the electrostatic chuck 134 is energized, thus attaching the movable section 109a to the base 106, and the piezoelectric elements 110 and 112 are made to expand, as illustrated in FIG. 13A. The section 109b thus moves from the position indicated by chain lines to the position indicated by solid lines. In the second period, the electrostatic chuck 136 is energized, thereby attaching the movable section 109b to the base 100. Simultaneously, the elements 110 and 112 are made to contract as shown in FIG. 12B. The movable section 109a therefore moves from the position indicated by chain lines to the position indicated by solid lines. Obviously, the movable section 109a, which is coupled to the base 146 by supports 142a and 142b, and the movable section 109b do not move during the first period and do move during the second period. That is to say, they intermittently move. Hence, while the sections 109a and 109b remain to move, the movable sections 150a and 150b are very slightly moved. While these sections 150a and 150b are at rest, the sections 109a and 109b are very slightly moved. Consequently, the table 104 is continuously moved in the direction of arrow 192 shown in FIG. 12A, or in the opposite direction.

To move the table 104 in the direction at right angles to the arrow 192 shown in FIG. 12A, the mechanism of FIGS. 8 and 9 operates in the following manner. For simplicity of explanation, the operation of only the first unit 100 will be described.

Figure 13B:
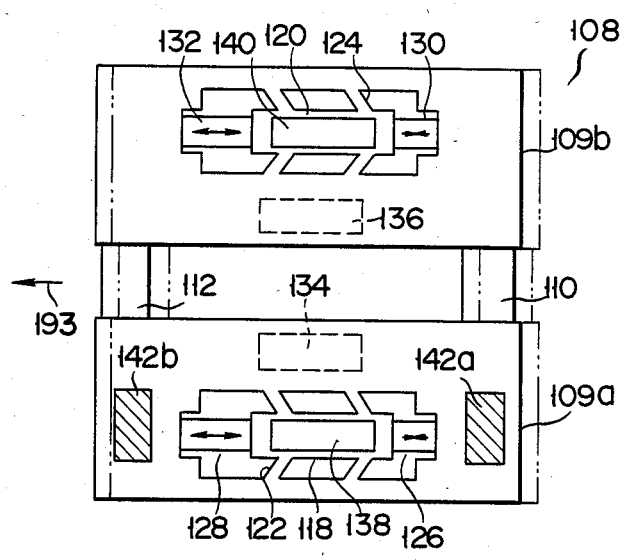

During the first period, the electrostatic chucks 134 and 136 are energized, thus attaching the movable sections 109*a* and 109*b* to the base 106 as shown in FIG. 13A. Simultaneously, the elements 126 and 130 are made to expand, and the elements 128 and 132 are made to contract. As a result, the assist movable sections 118 and 120 move very slightly to the left as shown in FIG. 13A. The resilient hinges 122 and 124 are deformed. During the second period, the chucks 134 and 136 are deenergized, thus releasing the sections 109*a* and 109*b* from the base 106, and the chucks 138 and 140 are energized, thus attaching the assist movable sections 118 and 132 to the base 106. Simultaneously, the elements 126 and 130 are made to contract, whereas the elements 128 and 132 are made to expand. Hence, the sections 109*a* and 109*b* move from the positions indicated by chain lines to the positions indicated by solid lines, as shown in FIG. 13B. The section 109*a*, which is coupled to the base 146 by the supports 142*a* and 142*b*, and the section 109*b* are immovable during the first period and move very slightly during the second period. That is to say, they move intermittently. While the sections 109*a* and 109*b* remain to move, the movable sections 150*a* and 150*b* move very slightly. On the other hand, while the sections 150*a* and 150*b* remain to move, the sections 109*a* and 109*b* move very slightly. Consequently, the table 106 moves in the direction of arrow 193, or in the opposite direction.

As mentioned above, with the precision moving mechanism of this invention, unlike with the conventional mechanism, it is possible to rotate or move a table continuously and at high speed without actuating piezoelectric elements very frequently. A simple and inexpensive power source can therefore be used to apply voltages to the piezoelectric elements. Since the table is rotated or moved by the expansion and contraction of the piezoelectric elements, which can be precisely controlled electrically, the table can be moved to any position and stopped at it. Further, the mechanism is simple in structure and does not require such parts as may easily be broken or deformed. Hence, it is reliable enough to be used in measuring apparatus or in apparatus for manufacturing semiconductor devices. Since all the parts of this mechanism can be made of nonmagnetic material, the mechanism can reliably function even if used in apparatus which use charged particles in the form of an electron beam or an ion beam.

The present invention is not limited to the embodiments described above. For instance, the electrostatic chucks used to selectively attach the movable sections to the bases may be replaced by vacuum chucks or electromagnetic chucks. Moreover, the driving unit for the piezoelectric elements may be constructed in various ways to suit the use. For example, it may be constructed such that a high voltage may be applied when it is desired to cause a very rough motion while a low voltage may be applied when it is desired to cause a fine motion. In brief, various changes and modifications can be made within the scope of the present invention.

What is claimed is:

1. A precision moving mechanism comprising:
   a first slight moving mechanism unit including:
   a first base,
   a first drive disk movably mounted on the first base and having first and second movable sections,
   a first piezoelectric element connected at one end to the first movable section and at the other end to the second movable section,
   a first member for attaching the first movable section to the first base, and
   a second member for attaching the second movable section to the first base;
   a second slight moving mechanism unit including:
   a second base supported by the first or second movable section of said first slight moving mechanism unit,
   a second drive disk movably mounted on the second base and having third and fourth movable sections,
   a second piezoelectric element connected at one end to the third movable section and at the other end to the fourth movable section,
   a third member for attaching the third movable section to the second base, and
   a fourth member for attaching the fourth movable section to the second base;
   a table supported by the third or fourth movable section of said second slight moving mechanism unit;
   a drive means for alternately driving the first and second members and alternately driving the third and fourth members, and for alternately driving the first or second member for attaching the movable section supporting said second base to said first base, and the third or fourth member for attaching the movable section supporting said table to said second base; and
   a voltage generating means for applying a voltage to the first and second piezoelectric elements, said voltage varying in synchronism with the drive cycle of said first and third members and causing said first and second piezoelectric elements to expand and contract with a phase difference of 180°.

2. A precision moving mechanism according to claim 1, wherein two bearings are provided at the center portions of said first and second drive disks and supporting said first and second drive disks rotatably on said first and second bases, respectively.

3. A precision moving mechanism according to claim 2, wherein said first drive disk has a resilient hinge provided at the center of rotation of said first drive disk and connecting the first and second movable sections, and said second drive disk has a resilient hinge provided at the center of rotation of said second drive disk and connecting the third and fourth movable sections.

4. A precision moving mechanism according to claim 1, wherein said first slight moving mechanism unit further includes a third piezoelectric element connected at one end to said first movable section and at the other end to said second movable section, and said second slight moving mechanism unit further includes a fourth piezoelectric element connected at one end to said third movable section and at the other end to said fourth movable section.

5. A precision moving mechanism according to claim 4, further comprising a means for applying a voltage to said third piezoelectric element in such a manner that said third piezoelectric element expands and contracts with a 360° phase difference from said first piezoelectric element, and a means for applying a voltage to said fourth piezoelectric element in such a manner that said fourth piezoelectric element expands and contracts with a 360° phase difference from said second piezoelectric element.

6. A precision moving mechanism according to claim 1, wherein said first, second, third and fourth members are electrostatic chucks each comprising an electrode and an insulative layer wrapping the electrode, and each adapted to attach the corresponding movable section to the base.

7. A precision moving mechanism according to claim 3, wherein each of said drive disks and each of said resilient hinges are formed by forming a plate member with notches.

* * * * *